US 7,286,030 B2

(12) United States Patent
Janot et al.

(10) Patent No.: US 7,286,030 B2
(45) Date of Patent: Oct. 23, 2007

(54) ELECTROMAGNETIC RELAY

(75) Inventors: Fabrice Janot, Saint Quentin Fallavier (FR); Patrice Becavin, Villefontaine (FR); Pascal Gonin, Frontonas (FR)

(73) Assignee: Radiall, Rosny-Sous-Bois (FR)

( * ) Notice: Subject to any disclaimer, the term of this patent is extended or adjusted under 35 U.S.C. 154(b) by 0 days.

(21) Appl. No.: 10/551,987

(22) PCT Filed: Apr. 9, 2004

(86) PCT No.: PCT/FR2004/000890

§ 371 (c)(1),
(2), (4) Date: Oct. 5, 2005

(87) PCT Pub. No.: WO2004/093113

PCT Pub. Date: Oct. 28, 2004

(65) Prior Publication Data

US 2006/0244555 A1    Nov. 2, 2006

(30) Foreign Application Priority Data

Apr. 14, 2003  (FR)  ................................. 03 04669

(51) Int. Cl.
*H01H 51/22* (2006.01)
(52) U.S. Cl. .............................. 335/78; 335/4; 335/80; 335/83
(58) Field of Classification Search .................... 335/4, 335/5, 78–86
See application file for complete search history.

(56) References Cited

U.S. PATENT DOCUMENTS 3,671,903 A * 6/1972 Arrington et al. ............ 336/96

5,808,533 A * 9/1998 Buscher et al. ............. 335/202

FOREIGN PATENT DOCUMENTS

| DE | 198 34 215 A1 | 2/2000 |
|---|---|---|
| EP | 0 352 884 A2 | 1/1990 |
| FR | 1 309 744 | 11/1962 |
| JP | A 7-14489 | 1/1995 |
| JP | A 7-211212 | 8/1995 |
| JP | 2003069302 A * | 3/2003 |

* cited by examiner

*Primary Examiner*—Ramon M. Barrera
(74) *Attorney, Agent, or Firm*—Oliff & Berridge, PLC

(57) ABSTRACT

The present invention relates to an electromagnetic relay comprising:
  a base comprising at least one printed circuit card, which card has at least two conductor tracks forming respective switch accesses;
  at least one conductive contact element movable between a closed position in which it presses against said two conductor tracks in order to establish an electrical connection between them, and an open position in which the contact element is spaced apart from at least one of said two tracks;
  a contact element support, the support comprising at least one flexible arm carrying the contact elements; and
  an actuator mounted on the printed circuit card, and comprising at least one coil constituted by a winding of electric wires;
  wherein the support includes at least one portion, in particular a portion in the form of a tongue, on which a moving member of the actuator acts in order to move said flexible arm of the support.

21 Claims, 6 Drawing Sheets

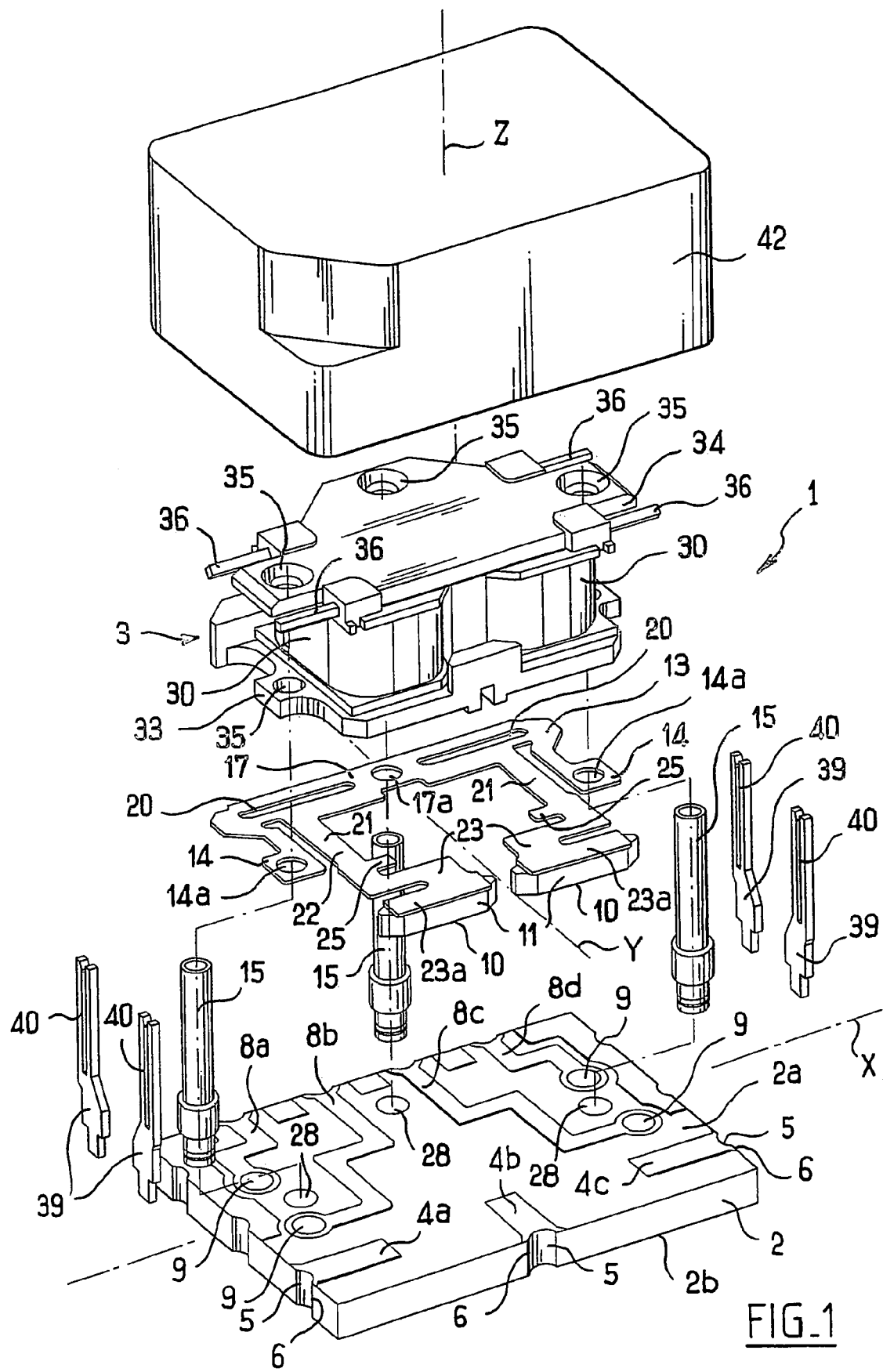
FIG_1

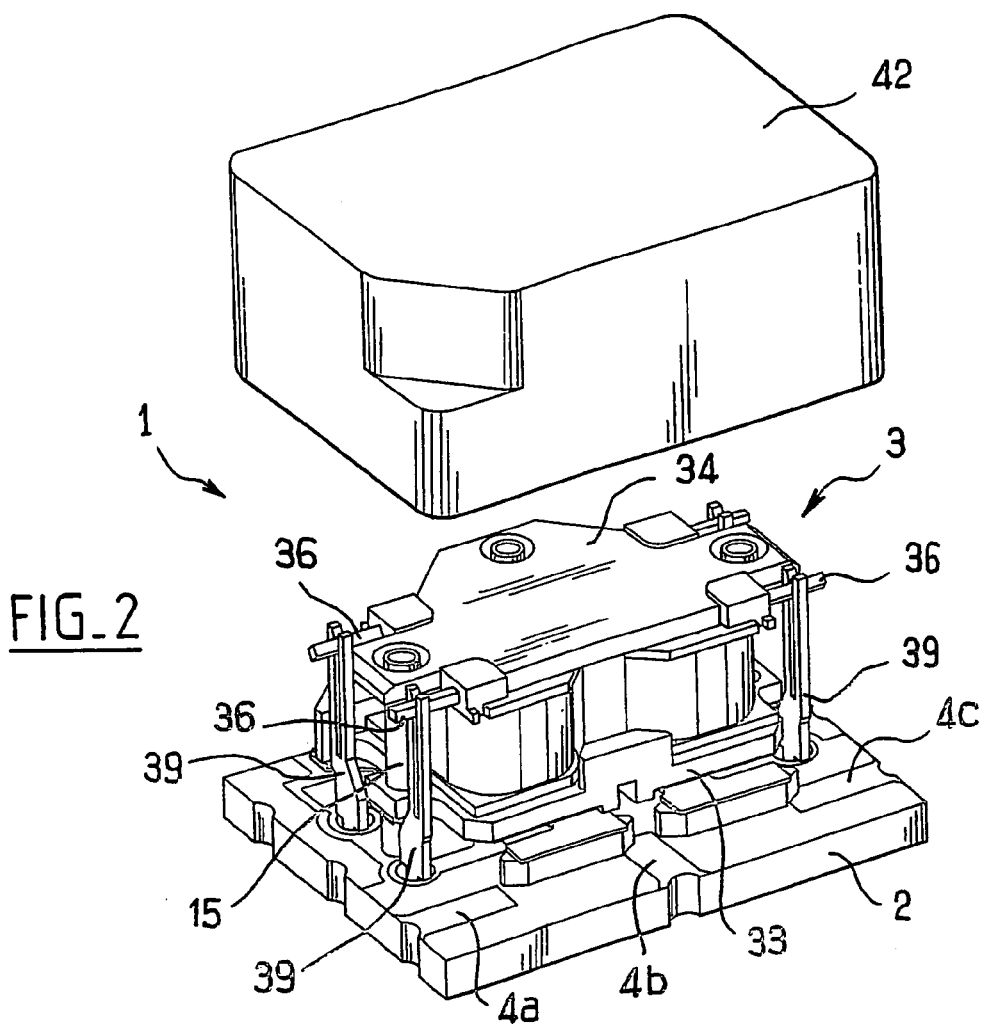
FIG_2
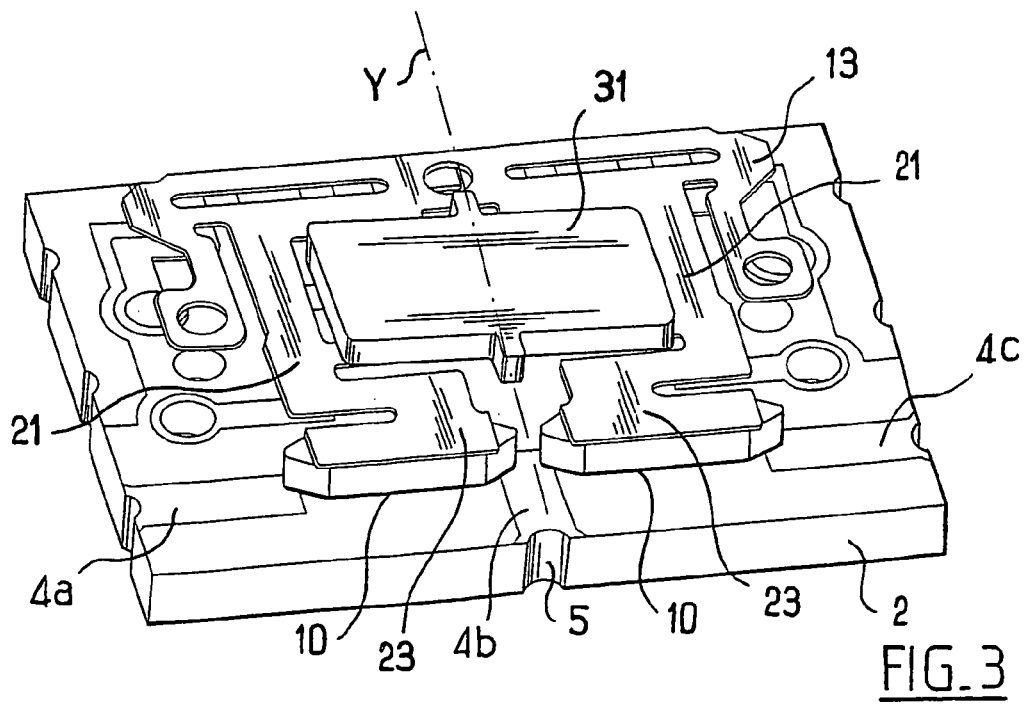
FIG_3

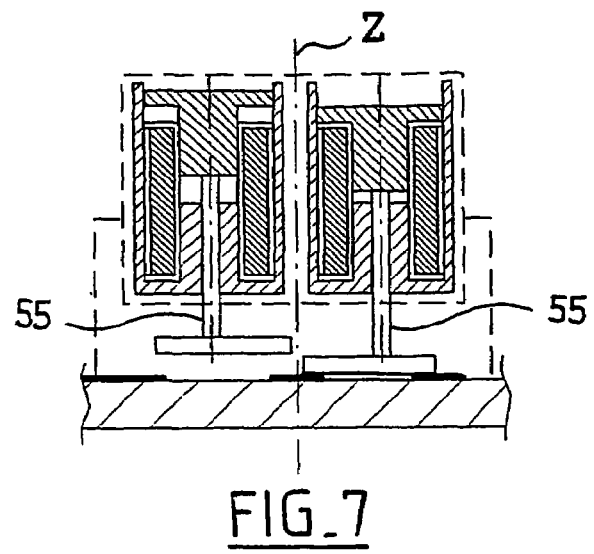
FIG_7
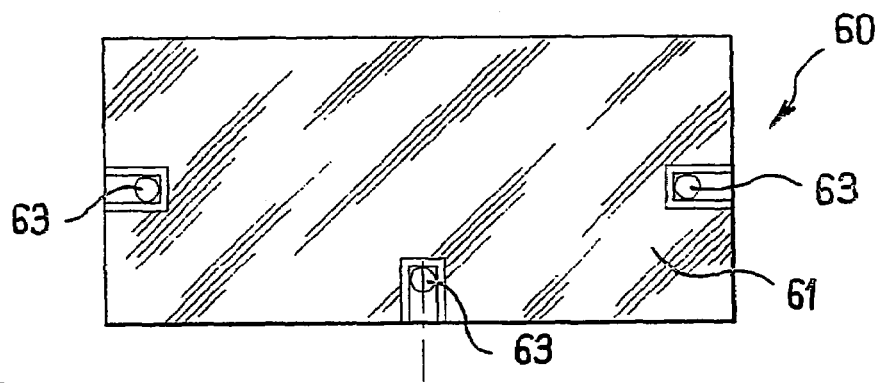
FIG_8
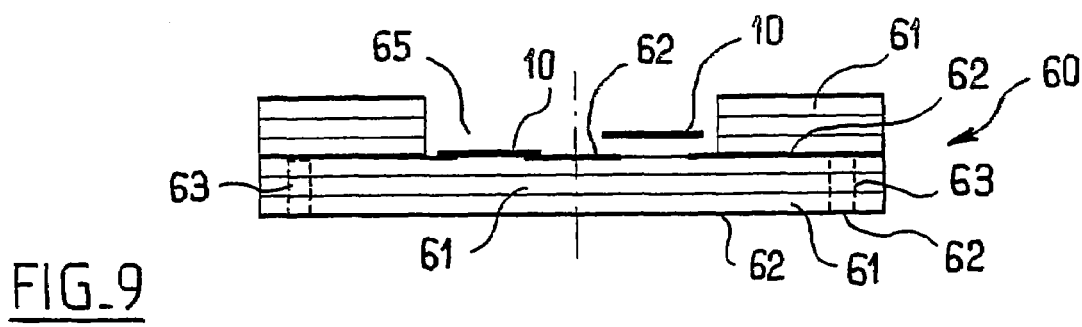
FIG_9
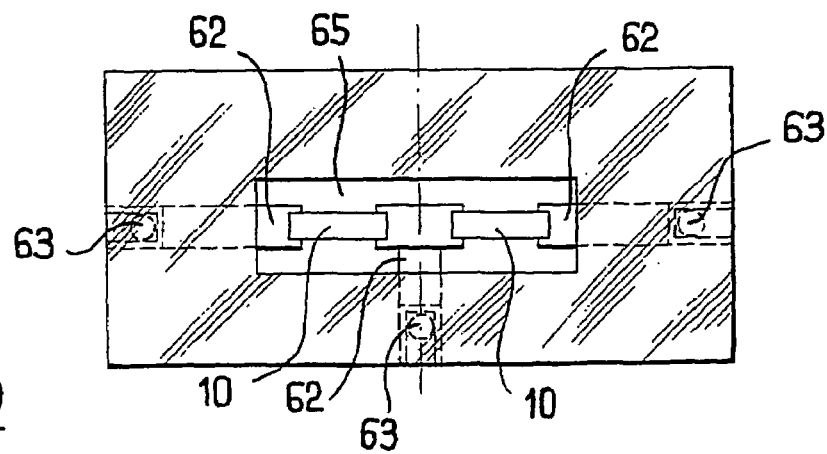
FIG_10

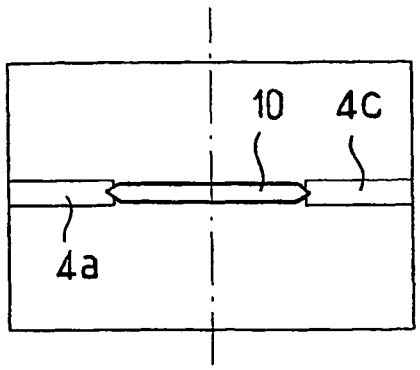
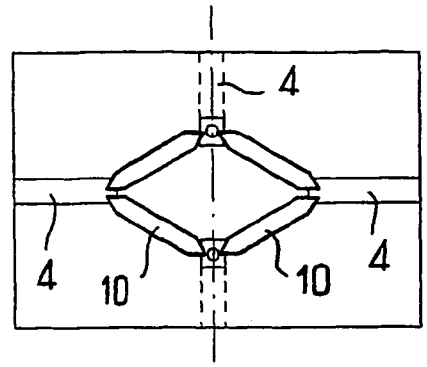
FIG_11  FIG_12
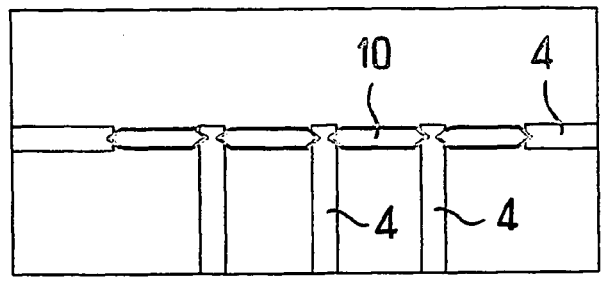
FIG_13
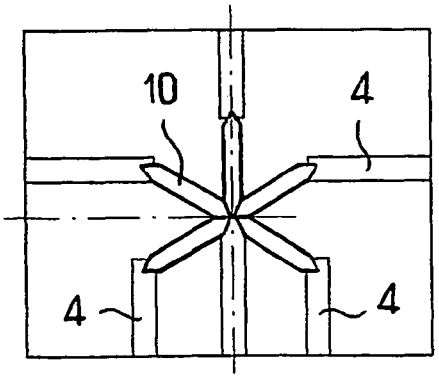
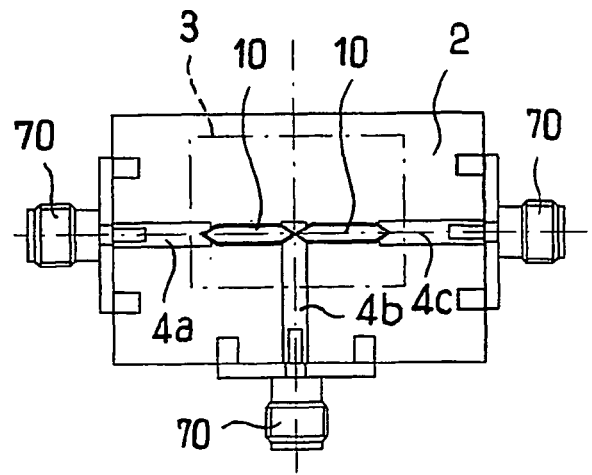
FIG_14  FIG_15

ELECTROMAGNETIC RELAY

The present invention relates to an electromagnetic relay for use in particular in the high frequency domain.

BACKGROUND OF THE INVENTION

U.S. Pat. No. 4,839,619 discloses a relay comprising a substrate, such as a printed circuit card having mounted thereon an assembly comprising a rotor and a magnetic armature carrying an elastomer layer and a dielectric layer. The dielectric layer has conductive strips suitable for switching conductor tracks on the substrate. The rotor can be driven not only in rotation about an axis perpendicular to the plane of the substrate, but it can also be moved axially along said axis. Since the rotor needs to be capable of being driven alternately in rotation and in translation, that relay presents a structure that is relatively complex, which can lead to a relatively high sale cost. That relatively complex structure can also make it more difficult to provide a relay that is compact and occupies only a small amount of space.

U.S. Pat. No. 6,081,176 discloses an electromagnetic relay comprising a system of magnets, a base, a moving contact element, stationary contact elements, and terminal contact elements. The base is formed by two printed circuit cards leaving between them a space suitable for receiving the moving contact element. The magnet system is not mounted on the base.

OBJECTS AND SUMMARY OF THE INVENTION

The invention seeks in particular to propose an electromagnetic relay that is relatively compact, occupying little space, and of structure that is relatively simple.

The invention provides an electromagnetic relay comprising:
- a base comprising at least one printed circuit card, which card has at least two conductor tracks forming two switch accesses;
- at least one conductive contact element movable between a closed position in which it presses against said two conductor tracks in order to establish an electrical connection between them, and an open position in which the contact element is spaced apart from at least one of said two tracks; and
- an actuator mounted on the printed circuit card, and comprising at least one coil constituted by a winding of electric wires;

the actuator being arranged in particular to be capable of moving the contact element solely in movement that does not include a component in rotation about an axis perpendicular to the plane of the printed circuit card.

By means of the invention, since the movement of the contact element can be a single, elementary movement, such as a pivoting movement or a movement in translation, the actuator can present a structure that is relatively simple.

The structure of the relay can be further simplified because the printed circuit card serves as a support for the actuator.

This makes it possible for the relay to be made compact, to occupy little space, and to present a small sale price.

The relay of the invention can be used for switching power that can be greater than 5 watts (W) and may be as great as about 200 W, at a frequency of 1 gigahertz (GHz), and in particular power of about 80 W.

In an embodiment of the invention, the relay further comprises a contact element support, the support comprising at least one flexible arm carrying the contact element.

Advantageously, the support includes at least one portion, in particular in the form of a tongue, on which a moving member of the actuator acts in order to move said flexible arm of the support.

Under such circumstances, the support is independent of the moving member, which can present the following advantages.

Firstly, assembly, handling, and storage of actuators is made easier since they do not have a contact element, where contact elements can be particularly fragile and sensitive to pollution. In addition, the actuators can be constituted by standard elements and can be preassembled.

The actuators may also be assembled on different types of printed circuit card, and can act on contact element supports of different shapes.

The invention also makes it possible to secure a plurality of actuators on a single printed circuit card using contact element supports of different shapes, thus making switching systems that are complex, and in particular making switch matrices.

Furthermore, the contact and locking forces and the switching voltages of the relay can be adjusted simply, merely by changing the distance between the actuator and the support.

The support may include at least one portion that is secured rigidly to a stationary portion of the relay.

This avoids friction between the support and said stationary portion of the relay, even when the flexible arm is being actuated, thus avoiding the formation of dust or shavings.

The invention also enables the contact elements to be accurately positioned relative to the conductor tracks and improves the repeatability of such positioning.

Since the contact element is not secured to the moving member of the actuator, it is not subjected to operating clearance that appears in the connection between the moving member and a stationary portion of the relay or of the actuator.

When there is a connection between the support and the moving member of the actuator, any variation in the position of the moving member during each switching operation gives rise to variation in the position of the contact element relative to the conductor tracks.

Improved repeatability in the positioning of the contact element guarantees excellent repeatability in microwave characteristics, in particular in terms of insertion losses and standing wave ratio, which characteristics are of great importance for measurement and instrumentation applications.

The above-mentioned moving member may comprise an armature suitable for pivoting, e.g. about an axis parallel to the plane of the printed circuit card.

The armature can be made as a single piece and/or can be substantially plane.

The support is preferably made as a single piece and is generally flexible.

The support can be made of a conductive material and can carry an insulating block arranged to insulate the contact element from the support.

This makes it possible to avoid short-circuit problems, and when the relay is used in the high frequency domain, it can avoid impedance being disturbed by the capacitive effect.

In an embodiment of the invention, the contact element comprises a conductive layer deposited on a first face of the insulating block, which block is secured to the support via a second face that is opposite from the first face.

In a variant, the contact element is constituted by a conductive blade and the insulating block is obtained by overmolding on the support and the blade.

In another embodiment of the invention, the support is made out of insulating material.

The contact element can then comprise a conductive layer deposited on a region of the support.

In general, the invention makes it possible to connect the contact element to the support without using an intermediate insulating part secured in an orifice of the support and liable to generate shavings by the part rubbing against the support.

In an embodiment of the invention, the support carries a plurality contact elements each associated with two switch accesses of the printed circuit card.

In an embodiment, the contact element is not carried by a flexible arm, but by a moving member of the actuator.

The moving member may comprise a rod suitable for being moved axially, perpendicularly to the plane of the printed circuit card, or an armature suitable for pivoting about an axis parallel to the plane of the printed circuit card, for example.

The contact element passes from the open position to the closed position, or vice versa, without sliding on the printed circuit card.

The printed circuit card may carry at least one electricity power supply conductor track that is electrically connected to said at least one electric coil. This connection can be implemented via a connection member that is separate from the coil or via a terminal of the coil.

The connection member may be arranged for being secured, in particular by soldering, in a hole of the printed circuit card, and it may comprise a pin with a slot in which a terminal of the coil can be engaged. The coil can be separate from the printed circuit card.

In an embodiment of the invention the base comprises a plurality of printed circuit cards that are stacked one on another and fastened together, the conductor tracks of the cards possibly being interconnected via plated-through holes made through the thickness of at least one of the cards.

The stack of printed circuit cards can form a stripline type structure enabling satisfactory performance to be obtained in the high frequency domain.

By placing conductor tracks at a plurality of levels in the stack, it is possible to implement switching functions that are more complex.

When the relay is of the surface mounting technology (SMT) type, at least one of the conductor tracks may be connected to a conductive strip extending across the thickness of the printed circuit card, said strip possibly being made on an edge face of the printed circuit card, and in particular being constituted by a metal-plated surface in a setback in the edge face of the card, or it may be constituted by the metal-plated wall of a hole through the printed circuit card.

The metal-plated strips serve to enable connections to be made by soldering between the conductor tracks on the relay card and the tracks on the circuit or the card that is to receive the relay.

Such soldering can be particularly reliable since it can be performed between two printed circuit cards made of materials of the same kind and presenting identical coefficients of thermal expansion.

In a variant, at least one of the conductor tracks is connected to a socket enabling a coaxial cable or a coaxial connector to be connected thereto.

The printed circuit card can be made on the basis of glass epoxy or of ceramic.

In an embodiment of the invention, the relay includes a cover secured to the printed circuit card, in particular by adhesive. It can be relatively easy to put the cover into place.

The relay may be of the single-pole double-throw (SPDT), double-pole double-throw (DPDT), double-pole triple-throw (DP3T), single-pole N-throw (SPNT), or N-pole N-throw (NPNT) type.

The actuator may be of the monostable type or of the bistable type.

The invention also provides a method of manufacturing an electromagnetic relay as specified above, the base comprising a plurality of printed circuit cards that are stacked on one another and fastened together, the method comprising the following steps:
  cutting out a plurality of printed circuit cards;
  etching conductor tracks on the cards;
  stacking the printed circuit cards; and
  firing the stack of cards so as to perform sintering.

To implement the above-specified method, it is possible in particular to use the so-called "low temperature cofired ceramics" technique.

The invention also provides an electromagnetic relay comprising:
  a base comprising at least one printed circuit card, which card has at least two conductor tracks forming two switch accesses;
  at least one conductive contact element movable between a closed position in which it presses against said two conductor tracks in order to establish an electrical connection between them, and an open position in which the contact element is spaced apart from at least one of said two tracks; and
  an actuator mounted on the printed circuit card, and comprising at least one coil constituted by a winding of electric wires;
  wherein the printed circuit card further comprises at least one electric power supply conductor track separate from the two conductor tracks forming switch accesses, and wherein the coil is connected to the electrical power supply tracks.

The invention also provides an electromagnetic relay comprising:
  a base comprising a plurality of printed circuit cards stacked on one another and fastened together, at least one of the printed circuit cards having at least two conductor tracks forming two switch accesses;
  at least one conductive contact element movable between a closed position in which it presses against said two conductor tracks in order to establish an electrical connection between them, and an open position in which the contact element is spaced apart from at least one of said two tracks; and
  an actuator mounted on the base and including at least one coil presenting a winding of electric wires.

BRIEF DESCRIPTION OF THE DRAWINGS

The invention can be better understood on reading the following detailed description of non-limiting embodiments, and on examining the accompanying drawings, in which:

FIG. 1 is a diagrammatic and fragmentary exploded view of an electromagnetic relay in accordance with the invention;

FIG. 2 is a diagrammatic and fragmentary view of the FIG. 1 relay after the actuator has been assembled on the printed circuit card;

FIG. 3 is a diagrammatic and fragmentary view of the card and of certain components of the actuator of the relay of FIGS. 1 and 2;

FIG. 7 is a diagrammatic and fragmentary axial section view of a relay constituting another embodiment of the invention;

FIGS. 8 to 10 are diagrammatic and fragmentary views of a relay base in another embodiment of the invention, seen respectively from below, the side, and above;

FIGS. 11 to 14 are diagrammatic and fragmentary views showing various switch access dispositions of a relay in accordance with the invention;

FIG. 15 is a diagrammatic and fragmentary view of a relay in another embodiment of the invention.

MORE DETAILED DESCRIPTION

Figure 4:
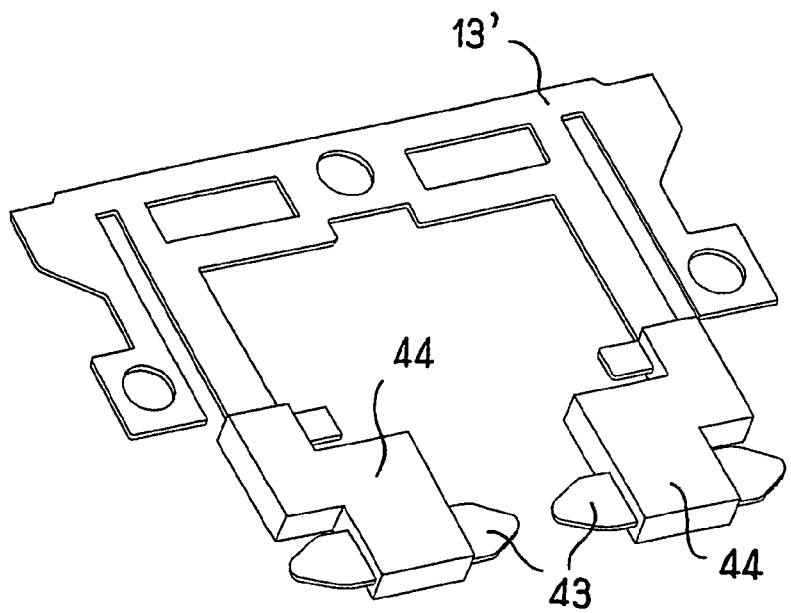
FIGS. 4 and 5 are diagrammatic and fragmentary perspective views showing a contact element support in two different variant embodiments of the invention.

FIG. 1 shows an electromagnetic relay 1 in accordance with the invention, comprising a base 2 constituted by a printed circuit card made on the basis of epoxy glass or ceramic, and an actuator 3 suitable for being mounted on the printed circuit card 2.

The card extends in a plane defined by two perpendicular axes X and Y.

In the example described, the card 2 has three conductor tracks 4a, 4b, and 4c on its top face 2a with the two tracks 4a and 4b forming a first pair of switch accesses and the two tracks 4b and 4c forming a second pair of switch accesses.

Each of the conductor tracks 4a-4c is connected at one end to a conductive strip 5 formed by plating metal on a setback 6 formed in an edge face of the card 2.

In the example described, the setbacks 6 are in the form of half-cylinders of axis Z perpendicular to the plane of the card 2. In a variant, the setbacks 6 could be in the form of quarter-cylinders. In another variant, the conductive strips 5 could each be made on the wall of a hole through the card 2. These strips 5 may also advantageously be made on a plane edge face of the card 2.

The conductive strips 5 serve to establish solder connections between the conductor tracks 4a-4c and conductor tracks on another printed circuit card that is to receive the relay 1.

The bottom face 2b of the card 2 may be metal coated, thereby making it possible, where necessary, to obtain satisfactory shielding and better impedance matching at high frequencies.

The card 2 also has four conductor tracks 8a-8d for feeding electricity, each connected at one end to a plated-through hole 9 and at its other end to a conductive strip 5 as defined above enabling said tracks 8a-8d to be connected to an electricity power supply.

Switching between the tracks 4a & 4b, or 4b & 4c respectively, is performed by two conductive contact elements 10 each movable between a closed position in which the corresponding contact element 10 presses against the respective pair of tracks 4a & 4b or 4b & 4c, thereby establishing an electrical connection between them, and an open position in which the contact element 10 is spaced apart from said pair of tracks.

Each contact element 10 is constituted by a layer of conductive material deposited on a plane first face of an insulating block 11, which block has a face opposite from its first face secured to a generally flexible conductive support 13.

The support 13 may be made of beryllium copper or of any other metal or alloy.

This support comprises two lateral portions 14 of axis Y, each provided with an orifice 14a for engaging on a support rod 15.

These lateral portions 14 are connected perpendicularly to a central portion 17 of axis X having an orifice 17a in its middle for engaging said portion 17 on a rod 15.

The central portion 17 has two slots 20 on either side of the orifice 17a.

The support 13 also has two flexible arms 21, each connected to the central portion 17 via a substantially rectilinear portion 22 of axis Y, extended by an end portion 23.

The end portion is substantially U-shaped, and of axis X when observed from above.

Connected to the portion 22, each arm 21 has a tongue 25 of axis X.

As can be seen in FIG. 1, the support 13 is axially symmetrical about the axis Y.

Each insulating block 11 is secured to the outermost limb 23a of the U-shape.

In the example described, the insulating block 11 and the corresponding conductive layer 10 are obtained by being cut out from a printed circuit card carrying a conductor track.

The rods 15 are designed to have their bottom ends secured in orifices 28 formed in the card 2.

In conventional manner, the actuator 3 comprises two coils 30, each presenting a winding of electric wires around a core, and serving to actuate a moving member that is constituted in the example described by an armature 31 that can be seen in FIG. 3.

The armature 31 is mounted on the actuator 3 in such a manner as to pivot about the axis Y, being capable of pressing in alternation against one or other of the tongues 25 of the support 13 so as to bend the corresponding arm 21 and cause the contact element 10 to move downwards in order to interconnect the tracks 4a & 4b, or 4b & 4c.

In an example not shown, the armature 31 may be replaced by members that can be moved linearly, parallel to the axis Z, each coming to press against one of the tongues 25 of the support 13.

The actuator 3 has bottom and top walls 33 and 34 provided with orifices 35 enabling the actuator 3 to be secured to the support rods 15, as shown in FIG. 2.

In the example described, each coil 30 has two terminals 36 projecting outwards.

Each of these terminals 36 is electrically connected to a corresponding power supply track 8a-8d via a respective pin 39.

Each pin 39 has a slot 40 in which a respective terminal 36 is engaged.

The bottom end of each pin 39 is secured in a plated-through hole 9 in the card 2, e.g. by soldering.

Thus, the actuator 3 is powered electrically via the conductor tracks 8a-8d, the pins 39, and the terminals 36.

This serves in particular to make the relay 1 more compact and to reduce its number of component parts.

In an example that is not shown, the terminals 36 of the coils 30 are arranged to be secured directly in the holes 9 in the card 2, without using pins 39.

The relay 1 has a cover 42 suitable for being secured to the card 2 by adhesive.

In a variant, the support rods 15 are made integrally with at least one of the bottom and top walls 33 and 34 of the actuator. In general, the actuator 3 can be secured to the card 2 in any appropriate way.

It would not go beyond the ambit of the present invention for the support carrying the contact elements to be made in some other way.

FIG. 4 shows a support 13' that differs from the above-described support 13 by the fact that each contact element is constituted by a conductive blade 43 and the insulating block 44 is obtained by being overmolded on the support 13' and the conductive blade 43.

Figure 5:
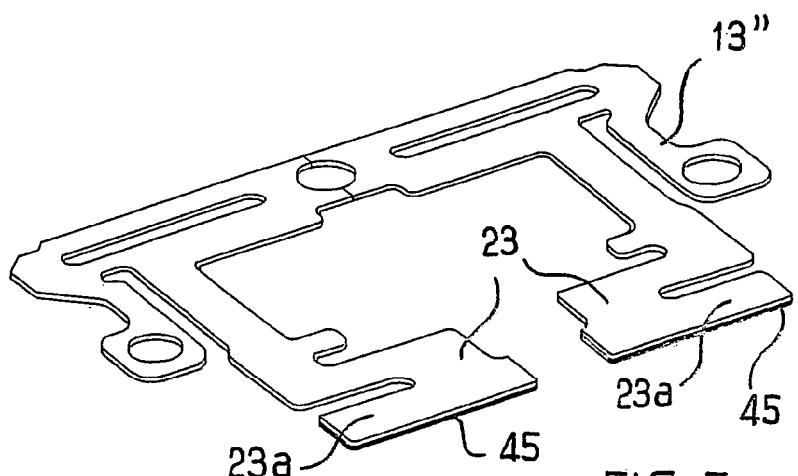

FIG. 5 shows a support 13" constituting another embodiment of the invention, which support 13" is made of an insulating material, e.g. based on a ceramic. The contact element is constituted by a layer of conductive material 45 deposited on one face of the limb 23a of the end portion 23.

In the example described with reference to FIG. 1, the support has portions that are rigidly secured to a stationary portion of the relay.

Figure 16:
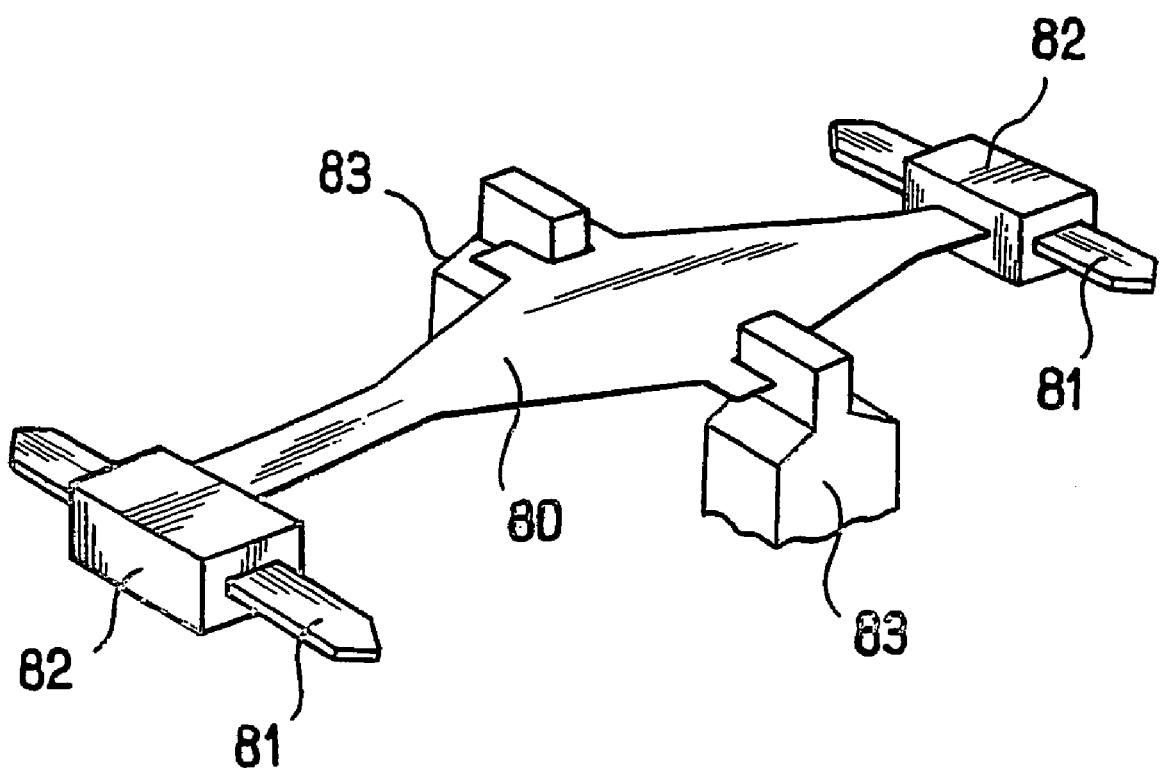
FIG. 16 is a diagrammatic and fragmentary view of a support in another embodiment of the invention.

In a variant, as shown in FIG. 16, the relay may have a support 80 that is flexible, carrying two contact elements 81 via two insulating blocks 82, which support 80 is pivotally secured on two stationary studs 83.

In the examples described above, the contact elements are made on a support that is generally flexible and that is moved by a moving member of the actuator.

In a variant, the contact elements may be made directly on a moving member of the actuator.

Figure 6:
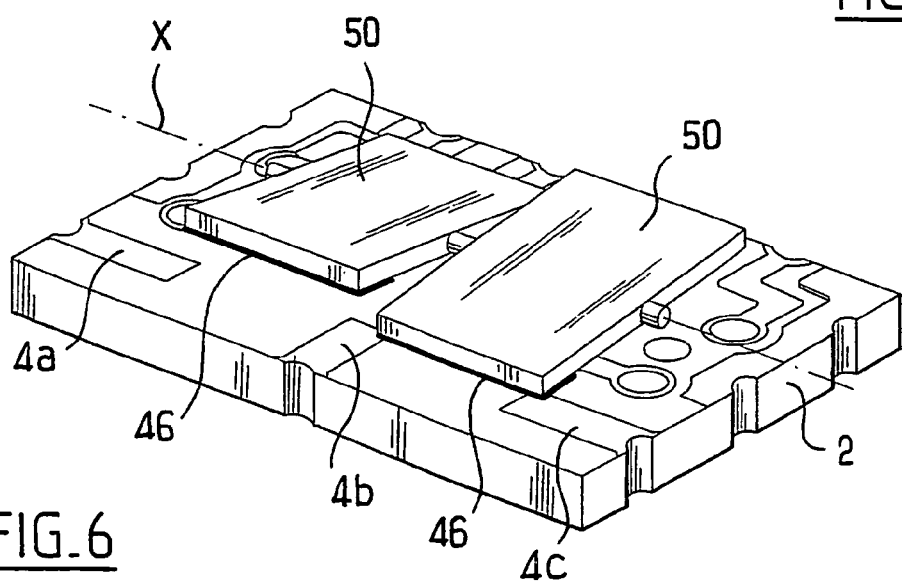
FIG. 6 is a view analogous to FIG. 3 showing a relay in a variant embodiment of the invention.

FIG. 6 shows an embodiment of the invention in which the contact elements are constituted by a conductive layer 46 deposited on two armatures 50 suitable for pivoting about the axis X.

In another variant, the contact elements may be carried by moving members 55 of the actuator that comprise pushers that are axially movable along the axis Z, as shown in FIG. 7.

The base of the relay may be constituted by a plurality of printed circuit cards that are stacked on one another and fastened together.

As shown in FIGS. 8 to 10, the stack 60 of printed circuit cards 61 made of ceramic material may carry conductor tracks 62 interconnected by plated-through holes 63 formed through the thickness of some of the cards 61.

The cards 61 situated in the top portion of the stack 63 may define a cavity 65 having a bottom onto which there run conductor tracks 62 forming switch accesses.

In particular, the stack of printed circuit cards makes it possible to obtain switching functions that are more complex.

In the example described, the stack is made using the low temperature cofired ceramics technique.

FIGS. 11 to 14 show various possible positions for the switch accesses.

FIG. 11 shows a disposition having two accesses that are switchable by a single contact element 10.

FIG. 12 shows a disposition having four accesses 4 that are switchable by four contact elements disposed in a lozenge configuration.

FIG. 13 shows a disposition having five accesses 4 that are switchable by four contact elements in alignment.

FIG. 14 shows a disposition having six accesses 4 that are switchable by five contact elements disposed in a star configuration.

Naturally, the invention is not limited to the embodiments described above.

In the examples described above, the relay is of the CMS type.

In a variant, and as shown in FIG. 15, the relay may include sockets 70, each secured to one end of a conductor track 4a-4b.

These sockets 70 make it possible without using tools to connect coaxial cables or coaxial connectors.

The sockets described in French patent No. 2 786 613 in the name of the Applicant company can be used in the relay of the present invention.

These sockets serve to connect a stripped coaxial cable to a printed circuit card.

The sockets 70 can be secured to the card 2 or they can be carried by a plate or a housing. The plate or the housing can also serve to provide protection and/or strength to the relay and enable the relay to be secured to equipment. They may also serve as a support for connection terminals for feeding electricity to the coils of the actuator.

The invention claimed is:

1. An electromagnetic relay comprising:
    a base comprising at least one printed circuit card, which card has at least two conductor tracks forming respective switch accesses;
    at least one conductive contact element movable between a closed position in which it presses against said two conductor tracks in order to establish an electrical connection between them, and an open position in which the contact element is spaced apart from at least one of said two tracks;
    a contact element support, the support comprising at least one flexible arm carrying the contact element; and
    an actuator mounted on the printed circuit card, and comprising at least one coil constituted by a winding of electric wires;
    wherein the support includes at least one portion, in particular a portion in the form of a tongue, on which a moving member of the actuator acts in order to move said flexible arm of the support, and
    wherein the support is made of a conductive material and carries an insulating block to insulate the contact element from the support.

2. A relay according to claim 1, wherein the contact element comprises a conductive layer deposited on a first face of the insulating block, which block is secured to the support via a second face that is opposite from the first face.

3. A relay according to claim 1, wherein the contact element is constituted by a conductive blade and wherein the insulating block is obtained by overmolding on the support and the blade.

4. A relay according to claim 1, wherein the support is made of an insulating material.

5. A relay according to claim 4, wherein the contact element comprises a conductive layer deposited on a region of the support.

6. A relay according to claim 1, wherein the support includes at least one portion that is rigidly secured to a stationary portion of the relay.

7. A relay according to claim 1, wherein the support carries a plurality of contact elements, each associated with two switch accesses of the printed circuit card.

8. A relay according to claim 1, wherein the moving member comprises an armature suitable for pivoting about an axis parallel to the plane of the printed circuit card.

9. A relay according to claim 1, wherein the support is made as a single piece.

10. A relay according to claim 1, wherein the printed circuit card has at least one electrical power supply conductor track electrically connected to said at least one coil.

11. A relay according to claim 10, wherein said connection is implemented via a connection member fastened in a hole in the printed circuit card.

12. A relay according to claim 11, wherein the connection member comprises a pin with a slot in which a terminal of the coil can engage.

13. A relay according to claim 1, wherein the base comprises a plurality of printed circuit cards that are stacked on one another and fastened together.

14. A relay according to claim 13, wherein the conductor tracks of the card are interconnected by plated-through holes made through the thickness of at least one of the cards.

15. A relay according to claim 1, wherein at least one of the conductor tracks is connected to a conductive strip extending across the thickness of the printed circuit card.

16. A relay according to claim 15, wherein said conductive strip is made on an edge face of the printed circuit card, being constituted in particular by a metal-plated surface in a setback in the edge face of the printed circuit card.

17. A relay according to claim 15, wherein the conductive strip is constituted by the metal-plated wall of a hole in the printed circuit card.

18. A relay according to claim 1, wherein at least one of the conductor tracks is connected to a socket enabling a coaxial cable or a coaxial connector to be connected thereto.

19. A relay according to claim 1, wherein the printed circuit card is made on the basis of glass epoxy or of ceramic.

20. A relay according to claim 1, including a cover secured to the printed circuit card, in particular by adhesive.

21. A relay according to claim 1, wherein the coil is separate from the card.

* * * * *